Oct. 18, 1966 W. E. HARDING ETAL 3,280,019

METHOD OF SELECTIVELY COATING SEMICONDUCTOR CHIPS

Filed July 3, 1963 2 Sheets-Sheet 1

INVENTORS
WILLIAM E. HARDING
ROBERT S. SCHWARTZ
BY Maurice H. Klitzman
ATTORNEY

Oct. 18, 1966 W. E. HARDING ETAL 3,280,019

METHOD OF SELECTIVELY COATING SEMICONDUCTOR CHIPS

Filed July 3, 1963

2 Sheets-Sheet 2

United States Patent Office 3,280,019
Patented Oct. 18, 1966

3,280,019
METHOD OF SELECTIVELY COATING SEMICONDUCTOR CHIPS

William E. Harding and Robert S. Schwartz, Poughkeepsie, N.Y., assignors to International Business Machines Corporation, New York, N.Y., a corporation of New York Filed July 3, 1963, Ser. No. 292,586
8 Claims. (Cl. 204—181)

This invention relates to coated semiconductor chips and a method of producting them; and more specifically to semiconductor chips having selectively coated surfaces and a method of obtaining a plurality of such selectively coated chips from a single semiconductor blank.

In the mounting of semiconductor chip devices, which have discrete contacts integral therewith, on printed circuit bearing supporting substrates, it is essential that the lateral surfaces of the semiconductor chip body be electrically insulated from the printed circuit. It is also essential that these surfaces be electrically insulated from the solder which is utilized to establish a permanent electrical connection between the printed circuit and the contact on the semiconductor device. Otherwise, the semiconductor body will become short-circuited to the printed circuit and the device will be inoperative and useless and the time spent making the connection will be to no avail.

Prior art attempts to prevent such short circuits have not all been entirely successful or if they have been successful, the methods used have had attendant disadvantages which are now, in view of the trend to smaller size semiconductor devices, considered to be onerous and limiting. For example, one known scheme for preventing short circuits of the type described is depicted in FIG. 1. As indicated by the drawing, it is desired to establish an electrical connection between the N-type material 2 forming a part of the semiconductor chip device generally shown by the numeral 4, and the solder-coated 6 printed circuit portion 7 formed on substrate 8. In this prior art scheme a copper ball 12 is utilized to establish an electrical connection between the N-type material 2 and the printed circuit 7, and as a spacer to maintain lateral surface 14 of the semiconductor chip device 4 displaced a sufficient distance from the solder-coated 6 printed circuit portion 7. With this spacing maintained, the solder 15 during the soldering operation is prevented from flowing partially up surface 14 and thereby short-circuiting the P-type material 16 to the printed circuit 7. An insulative coating 17 prevents the solder 15 from contacting undesired portions of the undersurface 18 of the semiconductor device 4.

However, the use of spacer balls according to the prior art method described in the preceding paragraph is not entirely satisfactory especially if the number of contacts per semiconductor device exceeds three. For example, if there are four connections to be made of the type shown in FIG. 1 and one ball is not of the proper size, it will be impossible for all four balls to simultaneously engage both the printed circuit surface and the surface of the semiconductor device. Such a condition prevents the semiconductor device from seating squarely on the balls and results in the formation of electrical connections, the resistance of which varies from connection to connection. In addition to this problem of nonuniformity of spacer balls, there is also the need for elaborate equipment to locate and position the balls prior to the soldering operation.

Our technique, shown in FIG. 2, for fabricating semiconductor chip devices, which are subsequently to be mounted on printed circuit bearing supporting members, avoids the problems of spacer balls by eliminating their use altogether. Instead, the lateral surfaces 14 of the chip 4 are coated with an insulative material 20 which permits the semiconductor chip 4 to be mounted directly on the printed circuit surface 7 without fear of short-circuiting. Any solder 22 that flows up the lateral surface of the chip is prevented from contacting the P-type material 16 by the presence of the insulating layer 20. Hence, short circuits between the P-type material 16 and the printed circuit 7 are elminated. It is to be noted that it is not necessary that the entire lateral surface 14 be coated, but only that the coating cover enough of the lower portion of the lateral surface as is necessary to insure that the solder does not contact any part of surface 14.

However, while our immedately above outlined technique has alleviated the problem of preventing short circuits of the type described, it has been found to have one halting drawback which has so far prevented its widespread use in certain applications. This problem, begotten by the minute physical size of the chips, involves the selective coating of only the lateral surfaces of the chip without the multiple handling and masking of each chip on an individual basis prior to the coating operation as would be required if conventional prior art coating techniques were to be employed. Due to the extremely small size of the chips, which are approximately 25 mils square by 8 mils thick, the conventional method of coating articles, which would require that each chip first be cut, then masked individually, and finally coated would result in a tedious, time consuming, and hence, expensive operation. This is because the chips, if coated by existing techniques, would be individually handled intermediate the cutting and masking operations, and intermediate the masking and coating operations. Of course, the multiple handling which would be required by prior art techniques is compounded by the extremely small size of the chips and the desire to only coat the lateral surfaces of the chips. While conventional gang coating would afford a partial solution to the problems associated with the minute size of the chips in that the chips would not have to be coated individually, the chips after having been cut from a larger block of material would still, one by one, be masked and then mounted on a multiple workholder in preparation for the conventional mode of gang coating. The objection to coating the chips by this method is that since each chip would first be cut from a larger block of material, in the subsequent masking and mounting operations, it would be necessary to mask and then mount in a multiple workholder, each chip on an individual basis. Such additional individual handling of the chips between (a) cutting and masking and (b) masking and mounting increases the likelihood of damage to the chips and is time consuming. It also necessitates additional steps and for other obvious reasons is undesirable.

It is an object of this invention to obviate the above mentioned shortcomings of the prior art.

It is another object of this invention to provide an improved process for coating semiconductor devices.

It is still another object of this invention to provide a process for coating semiconductor chips which adapts itself to mass production techniques.

Yet another object is to provide a selective coating process of the type described which does not require expensive, time consuming, and tedious masking techniques.

A further object is to provide a process whereby an insulative coating may be simultaneously applied to selected surfaces of a plurality of semiconductor chips without the necessity of prior painstaking handling of each individual chip.

A still further object is to provide coated semiconductor chips.

Another object is to provide selectively coated semiconductor chips which when mounted on printed circuits will not become short circuited.

Yet another object is to provide a product manufactured by a process of the type described which is reliable, inexpensive, durable and, uniform in quality.

Yet still another object is to provide a product manufactured by a process of the type described which permits solder connections to be made between contacts on the chip and contacts on a supporting member without short circuiting the body of the semiconductor chips to the supporting member contact.

Therefore, in accordance with one aspect of our invention we provide a process of coating the lateral surfaces of semiconductor chips which involve joining a selected surface of a semiconductor blank to the surface of a larger supporting base wherein the selected surface is effectively masked, applying to at least one of the remaining surfaces of the blank a masking overlay, dividing the masked and joined blank into a plurity of masked and joined chips, and thence coating the chip with an insulative material.

In accordance with a more detailed aspect of our invention a process is provided wherein a semiconductor blank is mounted on an electrode, is masked with an insulative material, is divided, and is electrophoretically coated with an insulative material.

In accordance with a still further aspect of our invention a process is provided wherein a semiconductor blank having a top and bottom surface is cemented to a cathode surface by an electrically conductive adhesive, is masked with an insulative material, is divided, and is coated with glass.

An advantage of our coating process is that time consuming and laborious handling of minute chips on an individual basis is kept to an absolute minimum while still obtaining high quality, uniform, and adherent coatings.

A further advantage of our coating process is that precise control of the coating thickness is possible.

Yet another advantage of our process is that strongly adherent insulative coatings may be applied to semiconductor chips without the use of binders, adhesives, or the like.

Yet another advantage of our invention is that coated chips are obtained with a minimum of expenditure of time and expense.

A still further advantage of our invention is that we provide a process of the type described which does not have critical operating conditions the maintenance of which is required to achieve optimum results.

The foregoing and other objects, features and advantages of our invention will be apparent from the following more particular description of a preferred embodiment, as illustrated in the accompanying drawings.

In the drawings wherein like reference numerals refer to like parts throughout the several views, FIG. 1 is a vertical section through a mounted semiconductor chip device which shows one known variety of short circuit preventing scheme wherein spacer balls are utilized to prevent short circuits;

Figure 3:
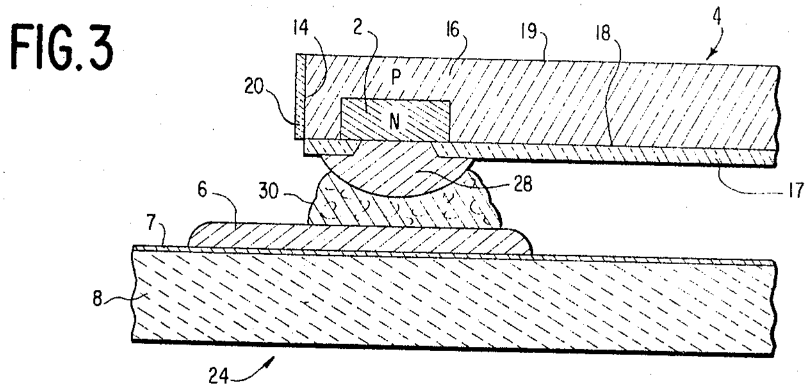
FIG. 3 is identical to FIG. 2 except that the semiconductor chip device has not been permanently mounted on the printed circuit bearing supporting member.

Referring now to FIG. 3, a sketch is provided of an unmounted semiconductor chip device generally shown as element 4, prior to the soldering operation. The chip device, which has its lateral surface coated according to the process of the invention, is later to be mounted on a printed circuit bearing supporting member generally indicated as element 24. The semiconductor chip device 4 comprises a right prism of P-type material 16 having four congruent lateral surfaces. Onto the bottom surface 18 of the chip device 4 has been doped, using doping techniques well known in the art, a small amount of N-type materials 2 thereby forming a semiconductor junction device. In electrical contact with the N-type material 2 is a deposit of solder 28 which facilitates the formation of the electrical connection. The solder 28 is prevented from contacting the lateral surface 14 of the P-type material 16 by insulative coating 20 which has been applied in accordance with our novel process. The undersurface 18 of the P-type material 16 is protected from contact with the solder 28 by insulative layer 17 which has been applied in a manner which forms no part of this invention. It is understood that the junction semiconductor chip device described so far is merely illustrative of one type of chip device to which our novel coating process may be applied and hence forms no part of our invention. The printed circuit bearing supporting substrate generally indicated as element 24 comprises a substrate 8 the top surface of which has applied thereto a solder-coated 6 printed circuit 7. Of course, any type of printed circuit bearing supporting substrate would be satisfactory and the type herein described is merely one possible variety. Finally, a suitable rosin flux 30 is applied to the respective surface portions which are to be electrically connected. Thus, FIG. 3 shows a known semiconductor device, which has its lateral surfaces coated in accordance with our novel coating process, and a printed circuit bearing supporting substrate just prior to the soldering operation wherein a permanent electrical connection is established between the N-type material 2 and the printed circuit 7.

Figure 1:
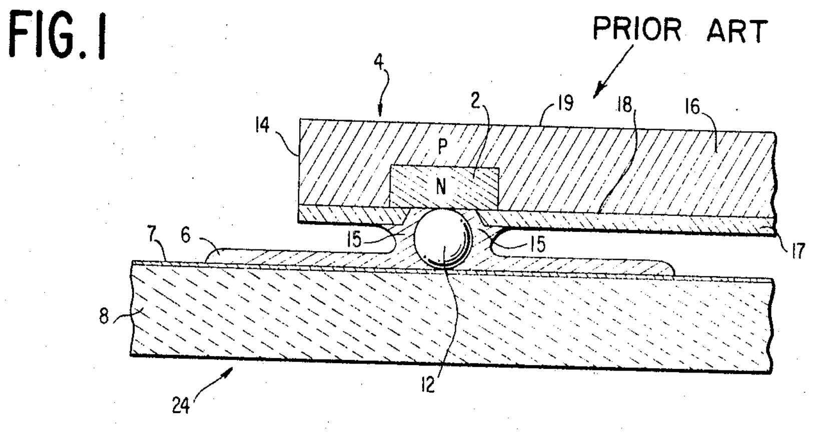
Figure 2:
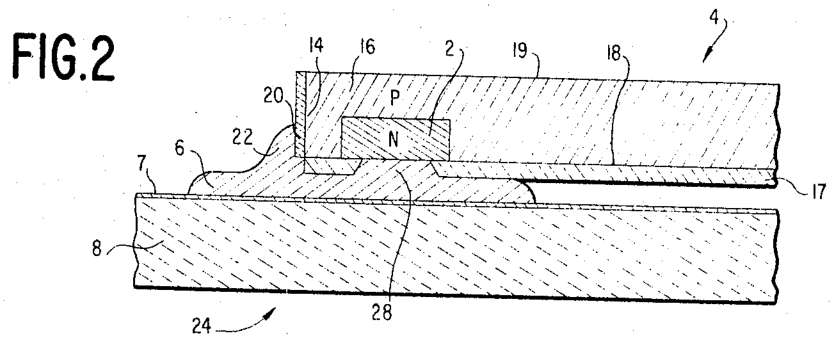
FIG. 2 is a vertical section through a mounted semiconductor chip device which shows our short circuit preventing scheme wherein an insulative coating on the lateral surfaces of the chip device is utilized to prevent short circuits.

Now referring to FIG. 2, a sketch is provided of a mounted semiconductor chip device generally shown as element 4, subsequent to the soldering operation. Like the chip device 4 of FIG. 3, the lateral surfaces 14 thereof have had an insulative coating 20 applied thereto in accordance with the process of our invention in an effort to prevent short circuits. The N–type material 2 is permanently electrically connected to the printed circuit 7. As a result of the soldering operation, the solder 22 has flowed partially up the lateral surface 14, but is electrically insulated therefrom by reason of the insulating coating 20 which had previously been applied to the chip in accordance with our novel coating process. Had not the lateral surface 14 been so coated in accordance with our process, the solder flow 22 would have short-circuited the P-type material 16 to the printed circuit 7. Summarizing, FIG. 2 shows a mounted semiconductor chip device 4 protected from short circuits by reason of an insulative coating 20 applied in accordance with our novel coating process.

Figures 4, 5:
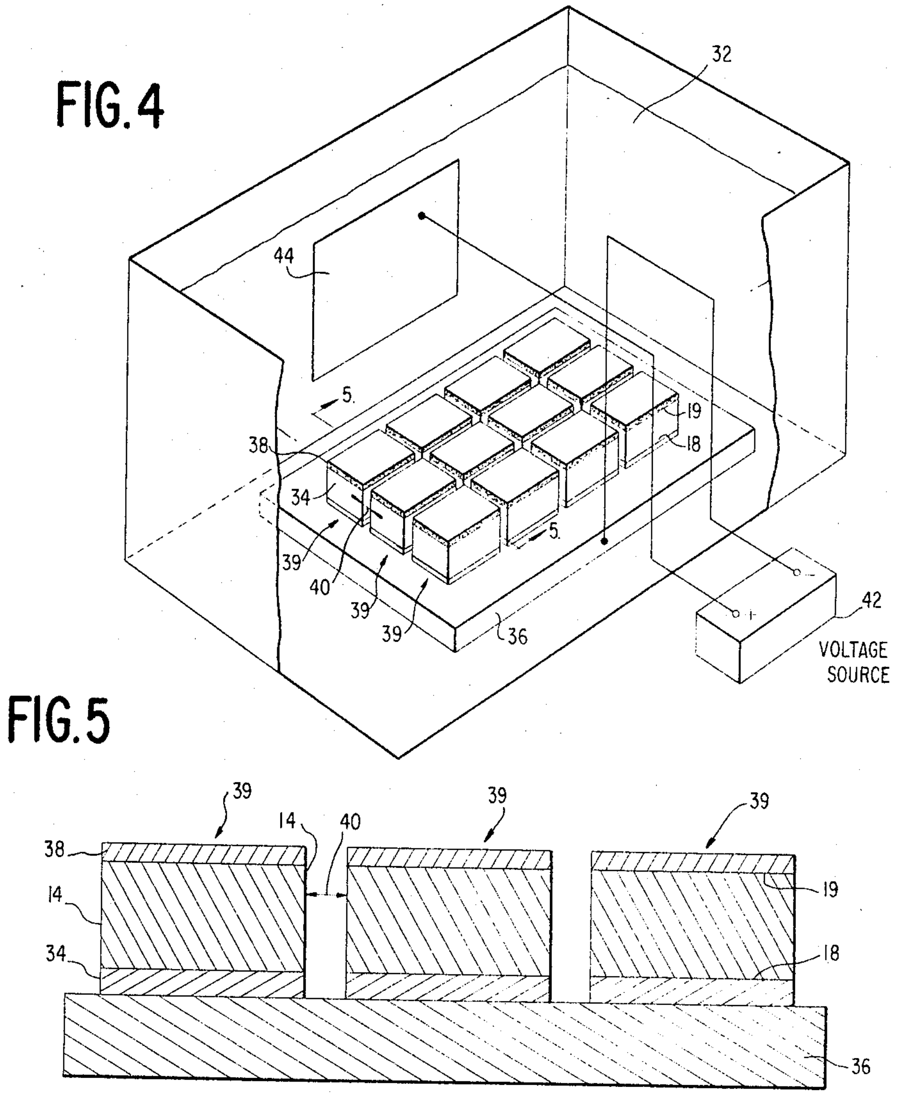
FIG. 4 is a perspective schematic showing the coating process at an intermediate point according to a preferred manner of performing our invention.
FIG. 5 is a vertical section through the masked and joined chips prior to the coating thereof.

Now referring to FIG. 4, a schematic in perspective is provided illustrating the coating technique at an intermediate point according to a preferred manner of performing our novel process. Prior to submersion in an electrophoretic bath 32, an uncut semiconductor blank (here shown already cut) is joined to an inert stainless steel cathode 36. The blank is substantially a planar slab one inch square by 8 mils thick. The size of the blank is not critical, but merely a matter of choice and larger blanks yielding more chips may be used if desired. It will also be understood that other inert cathode materials, for example, platinum, would be suitable. The joining of the uncut blank to the cathode 36 in accordance with our invention is facilitated by the use of an electrically conductive adhesive, preferably silver epoxy. However, any electrically conductive adhesive which is insoluble in the electrophoretic bath may be used. The adhesive may be applied to either of the mating surfaces, or to both, and may be applied in any convenient manner. As a result of this single joining step, two things have been accomplished. The bottom surface 18 of the blank has been effectively masked by the cathode 36 and an electrical connection has been established therebetween. Hence, no separate masking step is required to insure that the bottom surface 18 of the blank will remain uncoated during the subsequent side coating operation. Furthermore, a conductive path from the voltage source 42 to the blank can be later established without need of connecting wire leads directly to the blank and hence risking damage thereto. Instead, wire leads from the voltage source 42 can be connected to the cathode 36 by alligator clips or the like.

Having joined the bottom surface 18 of the uncut blank to the cathode 36, the top surface 19 of the blank is now ready for masking. A suitable insulative masking material 38 is applied in any convenient manner to the chip surface 19. Any insulative masking material may be used providing it is insoluble in the electrophoretic bath. Black wax, for example, has been found to provide a fine mask. At this point the blank has both its upper surface 19 and its lower surface 18 masked by masking overlay 38 and cathode 36, respectively, and hence is ready for the cutting operation. An ultrasonic cutter (not shown) using an oil base abrasive grit is used to divide the blank into a plurality of chips 39. The size of the chips 39 may vary, but for purposes of illustration may be said to have a cross section 25 mils square. Due to the cutting operation there will be a spacing 40 between the lateral surfaces 14 of the chips 39. The size of this spacing is dependent on the cutting means selected and in this case is in the neighborhood of 5 mils. Following the cutting step, it is desirable to wash the cut blank to remove all traces of the oil base abrasive grit. Thus, the only surfaces of the chips 39 which are exposed and subject to the coating to be next applied are the lateral surfaces 14; the top and bottom surfaces having been previously masked in order that only the lateral surfaces of the chip would be coated.

Once the washing step has been completed, the chip-bearing cathode 36, which is shown in vertical section in FIG. 5, is ready for submersion in the electrophoretic bath 32. While many baths could be used, one suitable bath has been found to comprise a 10 milligram per liter ethyl acetate dispersion of nonconductive, low-melting point, high purity glass particles, one-half micron or less in size. Glass particles having a composition comprising approximately 50% silicon dioxide, 29% lead oxide, 13% boron oxide, 7.5% aluminum oxide and 0.5% other oxide impurities, has been found to provide dense, adherent, insulative coatings. It will be understood by those skilled in the art that the above described bath is just one of many baths that could be successfully used to deposit an insulative coating. The dispersion medium and the dispersed phase could be varied as well as the relative proportions of each. For example, aluminum oxide or magnesium oxide particles could be substituted for the glass particles, and water or methanol could be substituted for the ethyl acetate. It will also be understood that the particle size may be varied. Generally, however, the larger the particles used, the less adherent the resultant coating will be. And, of course, it will be understood that depending on the charge of the ions that adhere to the surface of the particles, the electrode 36 may be either a cathode or anode; this change in electrode type being made by merely reversing the polarity of the connections to the voltage source 42.

Figure 6:
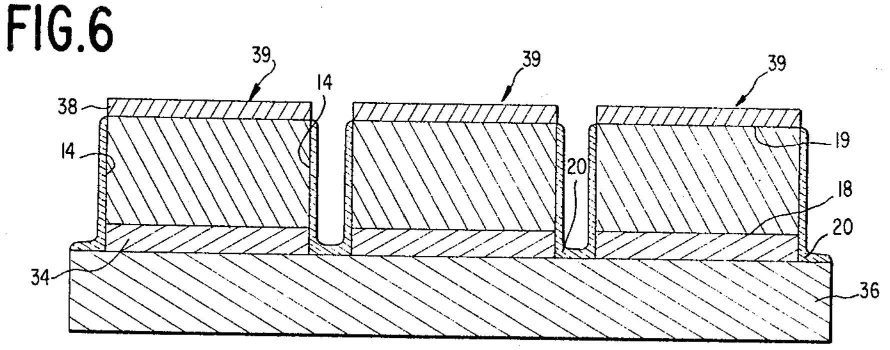
FIG. 6 is a vertical section through the masked and joined chips subsequent to the coating thereof.

Now, returning to FIG. 4, a D.C. voltage source 42 is shown connected to the electrodes 36 and 44. The voltage source 42 is utilized to establish a potential between the cathode 36 and the anode 44 and may be of any conventional type capable of supplying direct current. The anode 44 preferably is similar to the cathode 36 and in this case is a planar, inert stainless steel electrode. It is desirable to place the anode 44 parallel to the masked surfaces 19 of the chips 39 and spaced a slight distance therefrom. This insures a uniform deposition rate for all of the chips. After having positioned the anode 44 with respect to the chips 39, a potential of approximately 200 volts is applied to the electrodes 36 and 44 and a current of approximately 0.2 ma. is produced. Such a current will in five minutes provide a dense, substantially uniform coating of glass 20, as shown in FIG. 6, having a thickness of approximately 0.1 mil. With the exception of the exposed surfaces of the cathode, only the unmasked, lateral surfaces 14 of the chips are coated with glass. The masked surfaces 19 being of insulative material are not coated. By varying the length of the coating operation and/or the voltage applied, the deposition rate may be varied.

Having coated the lateral surfaces 14 of the chips 39, the chips are now ready to be removed from the bath 32, the masking material 38 removed from the chips, and the chips separated from the cathode 36. To remove the masking material 38 from the top surface 19 of the chips, any commercially available solvent may be used which is insoluble in silver epoxy and glass. Once having removed the masking material 38, the coated chips 39 may be separated from the cathode 36. Any commercially available epoxy stripper which does not effect the glass may be employed to remove the adhesive from the bottom surface 18 of the coated chips.

To improve the bonding strength of the glass coating 20, the coating may be fired in air for five minutes at 550° C. However, this is not required but merely a suggested method of improving the adhesive qualities of the coating and may be desirable if it is likely that the coated chips will be subject to rough and extended handling.

What has been described is a technique of obtaining from a single semiconductor blank, a plurality of semiconductor chips having their lateral surfaces coated with insulative material, said technique involving a minimum of handling of the individual chips. This is accomplished by cementing the blank to a supporting member, masking the blank while still uncut, cutting the cemented blank into chips, and then coating the masked chips while still mounted on the supporting member. Thus, in accordance with our process, the chips are handled for the first time as chips, subsequent to the coating operation; whereas prior art techniques if applied to produce side-coated chips would result in a process involving the handling of the chips on an individual basis prior to the coating operation as well as subsequent to it.

While the invention has been particularly shown and described with reference to a preferred embodiment thereof, it will be understood by those skilled in the art that various changes in form and details may be made therein without departing from the spirit and scope of the invention.

What is claimed is:

1. A method of producing from a single multisurfaced semiconductor blank a plurality of partially electrophoretically coated multisurfaced semiconductor chips comprising the steps of:

joining a selected surface of said blank to an electrode surface whereby said electrode surface effectively masks said selected surface and is in electrical contact therewith;

selectively applying to at least one of the remaining surfaces of said blank an insulative masking overlay;

dividing said joined and masked blank into a plurality of joined and masked chips; and electrophoretically coating the exposed surfaces of said plurality of joined and masked chips, with an insulative coating.

2. The process of claim 1 wherein said coating material is glass and said electrode is a cathode.

3. The process of claim 2 further including the step of firing said glass coating.

4. The process of claim 1 wherein said joining is accomplished by means of an electrically conductive adhesive.

5. The process of claim 1 wherein the electrophoretic coating step comprises the steps of:

submerging said joined and masked chips in a colloidal dispersion of insulative particles; and establishing an electric potential between said electrode and another submerged electrode located in proximity thereto whereby said insulative particles are deposited onto the unmasked surfaces of said chips.

6. The process of claim 5 wherein said insulative particles are low melting point, high purity glass.

7. The process of claim 6 further including the step of firing said deposited glass particles for approximately five minutes at a temperature above the melting point of said glass.

8. The process of claim 5 wherein said electrode is a cathode, said coating material is glass and said joining is accomplished by means of an electrically conductive adhesive.

References Cited by the Examiner

UNITED STATES PATENTS

| | | | |
|---|---|---|---|
| 2,495,630 | 1/1950 | Dorst | 204—181 X |
| 2,668,936 | 2/1954 | Robinson. | |
| 2,968,866 | 1/1961 | Soper et al. | 29—417 |
| 3,000,797 | 9/1961 | Gilman | 204—15 |
| 3,094,477 | 1/1963 | Jackson et al. | 204—181 X |
| 3,170,813 | 2/1965 | Duncan et al. | 117—118 X |

FOREIGN PATENTS

| | | |
|---|---|---|
| 928,547 | 6/1963 | Great Britain. |

ALEXANDER WYMAN, *Primary Examiner.*

JACOB STEINBERG, *Examiner.*

W. POWELL, *Assistant Examiner.*